(12) United States Patent
Inada et al.

(10) Patent No.: US 6,752,872 B2
(45) Date of Patent: Jun. 22, 2004

(54) COATING UNIT AND COATING METHOD

(75) Inventors: Hiroichi Inada, Kumamoto (JP); Shinichi Hayashi, Kumamoto (JP)

(73) Assignee: Tokyo, Electron Limited, Tokyo (JP)

( * ) Notice: Subject to any disclaimer, the term of this patent is extended or adjusted under 35 U.S.C. 154(b) by 139 days.

(21) Appl. No.: 09/972,866

(22) Filed: Oct. 10, 2001

(65) Prior Publication Data

US 2002/0041935 A1 Apr. 11, 2002

(30) Foreign Application Priority Data

Oct. 10, 2000 (JP) ........................................ 2000-309091

(51) Int. Cl.[7] .............................................. B05C 11/02
(52) U.S. Cl. ...................... 118/300; 118/52; 118/320; 118/326; 118/585; 118/61; 118/64
(58) Field of Search ........................... 118/300, 52, 320, 118/326, 58, 61, 64, 323; 141/65; 454/237–253; 96/372–379

(56) References Cited

U.S. PATENT DOCUMENTS

| | | | | |
|---|---|---|---|---|
| 5,472,502 A | * | 12/1995 | Batchelder | 118/52 |
| 5,565,034 A | * | 10/1996 | Nanbu et al. | 118/668 |
| 5,672,205 A | | 9/1997 | Fujimoto et al. | |
| 5,690,995 A | * | 11/1997 | Fischli et al. | 427/180 |
| 6,159,541 A | * | 12/2000 | Sakai et al. | 427/240 |
| 6,333,003 B1 | * | 12/2001 | Katano et al. | 422/4 |

* cited by examiner

Primary Examiner—Richard Crispino
Assistant Examiner—Michelle Acevedo Lazor
(74) Attorney, Agent, or Firm—Oblon, Spivak, McClelland, Maier & Neustadt, P.C.

(57) ABSTRACT

The present invention is a coating unit for applying a coating solution on a substrate, comprising: a container enclosing the substrate; a casing for accommodating the container therein; a supply device for supplying a predetermined gas into the casing; a first exhaust pipe for exhausting an atmosphere inside the container; a second exhaust pipe for exhausting an atmosphere inside the casing; a first adjusting device which is disposed in the first exhaust pipe, for adjusting a flow rate of an atmosphere passing through the first exhaust pipe; and a second adjusting device which is disposed in the second exhaust pipe, for adjusting a flow rate of an atmosphere passing through the second exhaust pipe. According to the present invention, the second exhaust pipe is usable for adjusting the exhaust flow rate to maintain a pressure inside the casing at a positive pressure. This makes it possible to divide, with the use of the first exhaust pipe and the second exhaust pipe, the work which satisfies the conditions of exhausting the atmosphere inside the casing to maintain the pressure inside the casing at the positive pressure relative to an amount of the supplied gas and exhausting the atmosphere inside the container at a predetermined flow rate or higher to prevent the atmosphere inside the container from flowing out of the container. Thereby, the atmospheres inside the casing and the container can be controlled more easily.

9 Claims, 7 Drawing Sheets

COATING UNIT AND COATING METHOD

BACKGROUND OF THE INVENTION

1. Field of the Invention

The present invention relates to a coating unit and a coating method for a substrate.

2. Description of the Related Art

In a photolithography process, for example, in semiconductor device fabrication processes, resist coating treatment for applying a resist solution on a surface of a substrate, for example, a semiconductor wafer (hereinafter referred to as a 'wafer'), to form a resist film, exposure processing for exposing the wafer in a pattern, developing treatment for developing the wafer after being exposed in the pattern, and so on are performed to form a predetermined circuit pattern on the wafer.

The above resist coating treatment is usually performed in a resist coating unit, and for example, a cylindrical cup with an upper part thereof being open is provided inside a casing of the resist coating unit and a spin chuck for holding the wafer by suction to rotate the wafer is provided inside the cup. The resist coating treatment for the wafer is performed in a manner in which the rotated wafer is supplied with the resist solution onto the center thereof, the resist solution on the wafer is diffused by a centrifugal force which is caused by the rotation, and a uniform resist film is formed on the wafer.

Furthermore, atmospheres inside the casing and the cup need to be maintained at predetermined temperature and humidity when the resist coating treatment is performed. For this purpose, a supply device for supplying gas such as air and inert gas to the wafer inside the cup and an exhaust device for exhausting the atmosphere inside the cup from a bottom portion of the cup are provided in the resist coating unit. Conventionally, only this exhaust device is provided as an exhaust device for exhausting an atmosphere inside the resist coating unit and an amount of the gas supplied by the supply device and an amount of the atmosphere exhausted by the exhaust device are adjusted to maintain a processing environment of the resist coating treatment.

However, since film thickness of the resist film varies depending on a flow speed when the above-mentioned gas is supplied, it is necessary to maintain the flow speed of the gas within a predetermined range and it is also necessary to maintain a pressure inside the casing at a positive pressure in order to prevent impurities from the outside of the casing from flowing into the casing while maintaining a flow rate of the above-mentioned exhausted gas at a certain level or higher in order to prevent impurities produced from the wafer from flowing out of the cup. Therefore, it is very difficult to adjust each of the exhaust flow rates and the flow rate of the supplied gas with only one exhaust device and the supply device as described above to satisfy all of the above conditions.

SUMMARY OF THE INVENTION

The present invention is made in consideration of the above-described aspects, and its object is to provide a coating unit and a coating method capable of further facilitating atmosphere control in a casing and a cup.

In order to achieve the above object, a coating unit according to the present invention is a coating unit for applying a coating solution on a substrate, comprising: a container enclosing the substrate; a casing for accommodating the container therein; a supply device for supplying a predetermined gas into the casing; a first exhaust pipe for exhausting an atmosphere inside the container; a second exhaust pipe for exhausting an atmosphere inside the casing; a first adjusting device which is disposed in the first exhaust pipe, for adjusting a flow rate of an atmosphere passing through the first exhaust pipe; and a second adjusting device which is disposed in the second exhaust pipe, for adjusting a flow rate of an atmosphere passing through the second exhaust pipe.

A coating method according to the present invention is a coating method for applying a coating solution on a substrate, wherein utilized is a coating unit comprising: a container enclosing the substrate; a casing for accommodating the container therein; a supply device for supplying a predetermined gas into the casing; a first exhaust pipe for exhausting an atmosphere inside the container; a second exhaust pipe for exhausting an atmosphere inside the casing; a first adjusting device which is disposed in the first exhaust pipe, for adjusting a flow rate of an atmosphere passing through the first exhaust pipe; and a second adjusting device which is disposed in the second exhaust pipe, for adjusting a flow rate of an atmosphere passing through the second exhaust pipe, and the coating method comprising the step of adjusting a flow rate of the atmosphere inside the casing which is exhausted from the second exhaust pipe to maintain a pressure inside the casing at a higher level than a pressure outside the casing.

According to the present invention, the second exhaust pipe for exhausting the atmosphere inside the casing is provided separately in addition to the first exhaust pipe for exhausting the atmosphere inside the container so that the exhaust flow rate can be adjusted by the second exhaust pipe to maintain the pressure inside the casing at a positive pressure. This makes it possible to divide, with the use of the first exhaust pipe and the second exhaust pipe, the work which satisfies the conditions of exhausting the atmosphere inside the casing to maintain the pressure inside the casing at the positive pressure relative to the amount of the supplied gas and exhausting the atmosphere inside the container at a predetermined flow rate or higher to prevent the atmosphere inside the container from flowing out of the container as described above. Consequently, the atmospheres inside the casing and the container can be controlled more easily.

According to the present invention, the use of the second exhaust pipe for maintaining the pressure inside the casing at the positive pressure makes it possible to have the works of adjusting the exhaust flow rate of the atmosphere inside the container and adjusting the positive pressure inside the casing, which are conventionally carried out by one exhaust pipe, performed separately by different exhaust pipes to facilitate each of the adjustments.

DETAILED DESCRIPTION OF THE PREFERRED EMBODIMENTS

Figure 1:
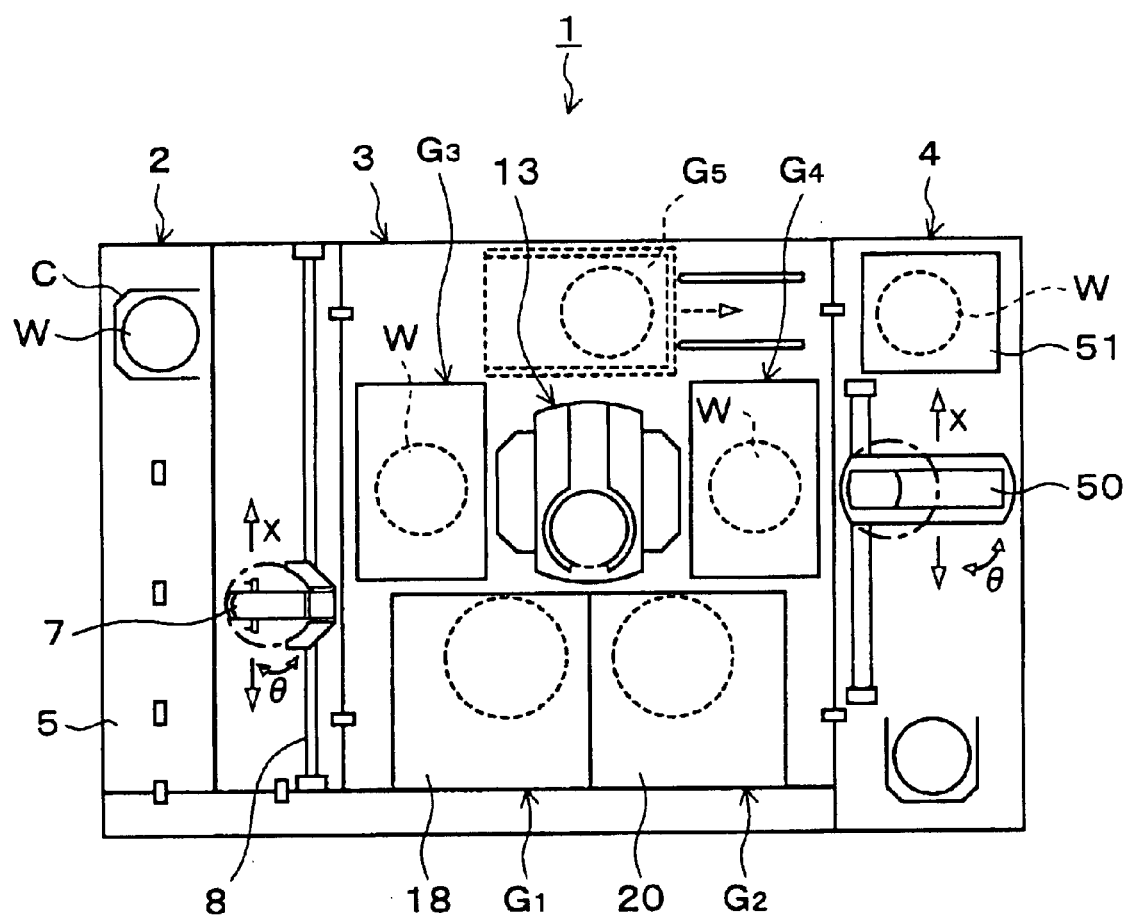
FIG. 1 is a plan view showing a schematic structure of a coating and developing treatment system including a resist coating unit according to an embodiment of the present invention.
Figure 2:
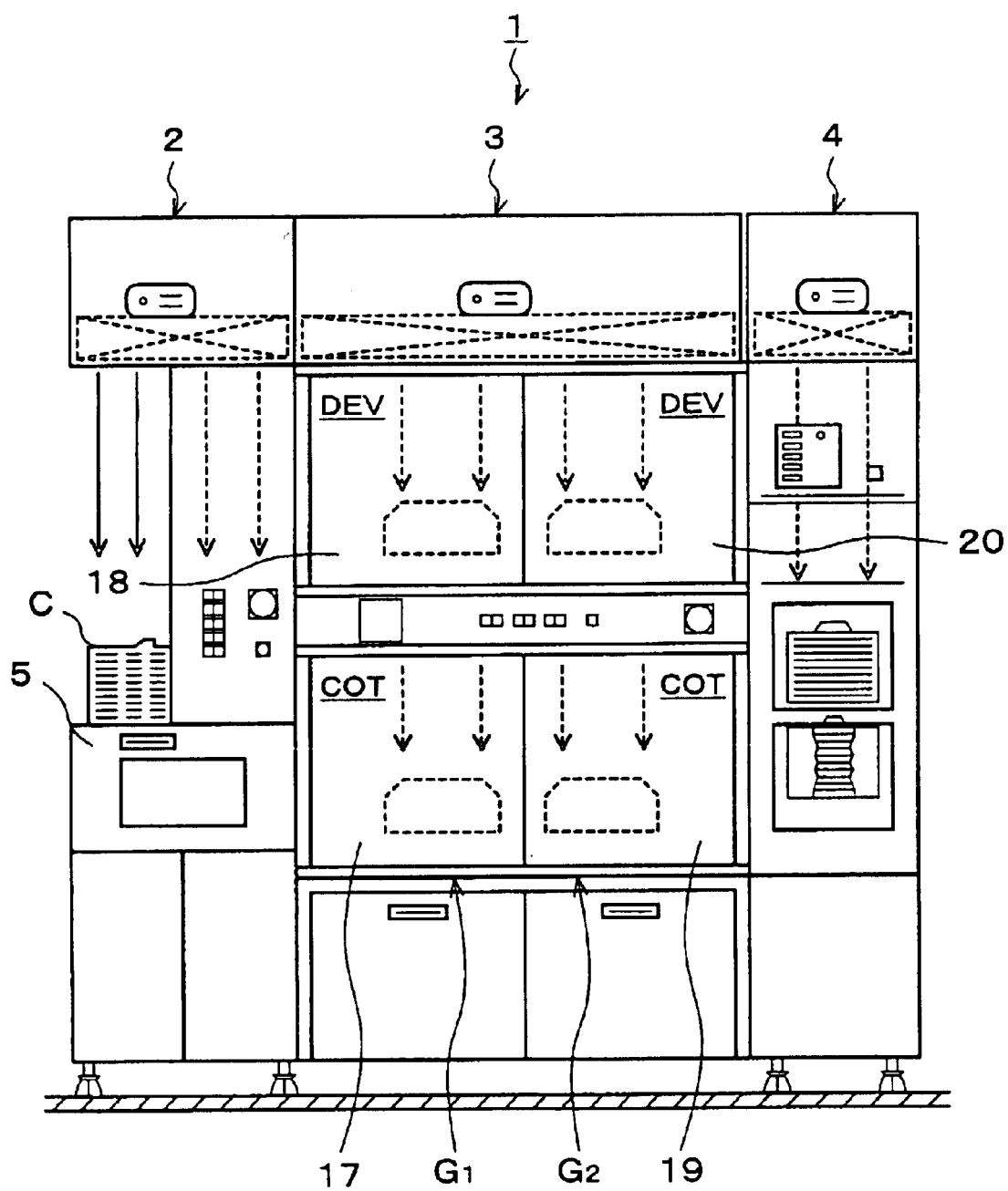
FIG. 2 is a front view of the coating and developing treatment system in FIG. 1.
Figure 3:
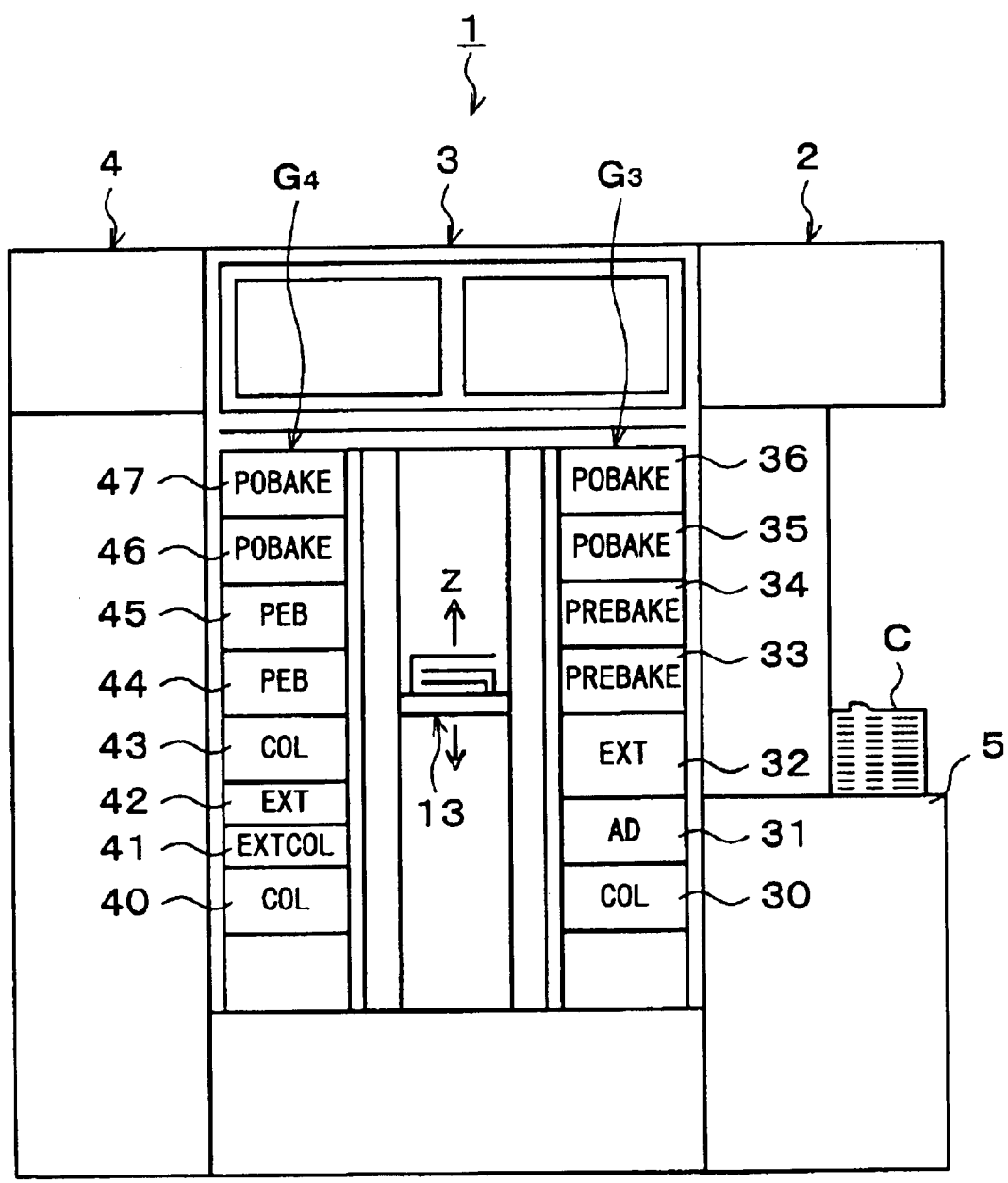
FIG. 3 is a rear view of the coating and developing treatment system in FIG. 1.

Preferred embodiments of the present invention will be described below to detail the present invention. FIG. 1 is a plan view of a coating and developing treatment system 1 including a coating unit according to the present invention, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering the wafers W to/from a not-shown aligner which is disposed adjacent to the processing station 3 are integrally connected.

In the cassette station 2, a plurality of the cassettes C are mountable in predetermined positions on a cassette mounting table 5, which serves as a mounting portion, in a line in an X direction (a vertical direction in FIG. 1). Furthermore, a wafer carrier 7, which is movable in the alignment direction of the cassettes (the X direction) and in an alignment direction of the wafers W housed in the cassette C (a Z direction; a perpendicular direction), is provided to be movable along a carrier path 8 so that it is selectively accessible to each of the cassettes C.

The wafer carrier 7 has an alignment function for aligning the wafers W. The wafer carrier 7 is structured so as to be also accessible to an extension unit 32 included in a third processing unit group G3 on a processing station 3 side as will be described later.

In the processing station 3, a main carrier 13 is provided in a center part thereof, and various kinds of the processing units are multi-tiered on a periphery of the main carrier 13 to constitute a processing unit group. In the coating and developing treatment system 1, where four processing unit groups G1, G2, G3 and G4 are provided, the first and the second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by the broken line is allowed to be additionally disposed on a rear side as an option. The main carrier 13 is capable of carrying the wafers W to/from various kinds of later described processing units which are disposed in these processing unit groups G1, G2, G3, and G4. Incidentally, the number and the arrangement of the processing unit groups vary depending on which kind of processing is performed on the wafers W and the number of the processing unit groups is optionally selective accordingly.

In the first processing unit group G1, for example, as shown in FIG. 2, a resist coating unit 17 serving as a coating unit according to this embodiment and a developing unit 18 for developing the wafers W after exposure processing are two-tiered in the order from the bottom. Similarly, in the second processing unit group G2, a resist coating unit 19 and a developing unit 20 are two-tiered in the order from the bottom.

In the third processing unit group G3, for example, as shown in FIG. 3, a cooling unit 30 for cooling the wafers W, an adhesion unit 31 for increasing fixability between a resist solution and the wafers W, the extension unit 32 for keeping the wafers W on standby therein, pre-baking units 33 and 34 for drying a solvent in the resist solution, post-baking units 35 and 36 for performing heat treatment after the developing treatment, and so on are, for example, seven-tiered in the order from the bottom.

In the fourth processing unit group G4, for example, a cooling unit 40, an extension and cooling unit 41 for spontaneously cooling the mounted wafers W, an extension unit 42, a cooling unit 43, post-exposure baking units 44 and 45 for performing heat treatment after the exposure processing, post-baking units 46 and 47, and so on are, for example, eight-tiered in the order from the bottom.

In a center part of the interface section 4, a wafer carrier 50 is provided. The wafer carrier 50 is structured so as to be movable in the X direction (the vertical direction in FIG. 1) and the Z direction (the perpendicular direction), and to be rotatable in a θ direction (a rotational direction about an axis Z), so that it is accessible to the extension and cooling unit 41 and the extension unit 42 which are included in the fourth processing. unit group G4, a peripheral aligner 51, and the not-shown aligner to carry the wafers W to each of them.

Figure 4:
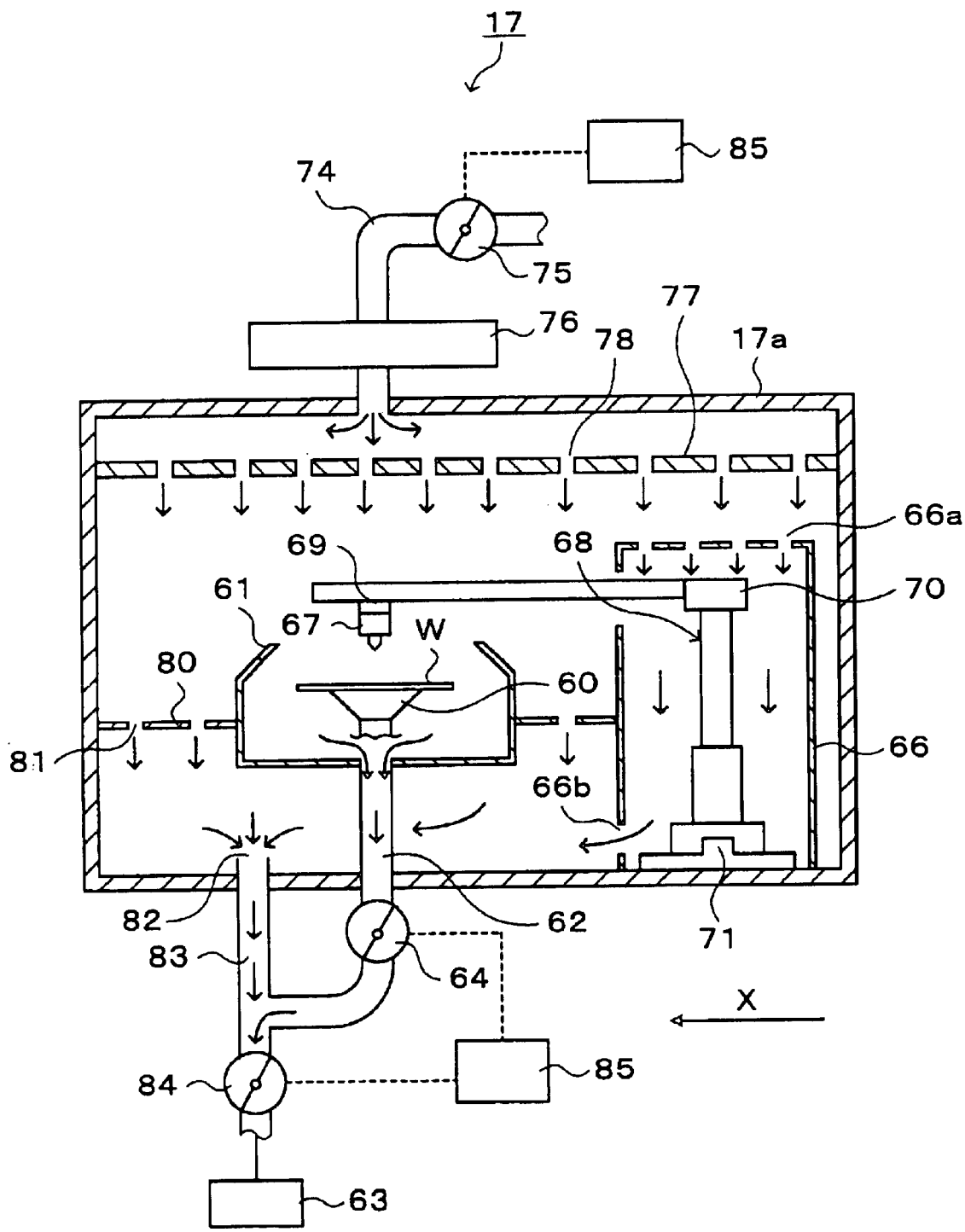
FIG. 4 is an explanatory view of a vertical cross section of the resist coating unit.
Figure 5:
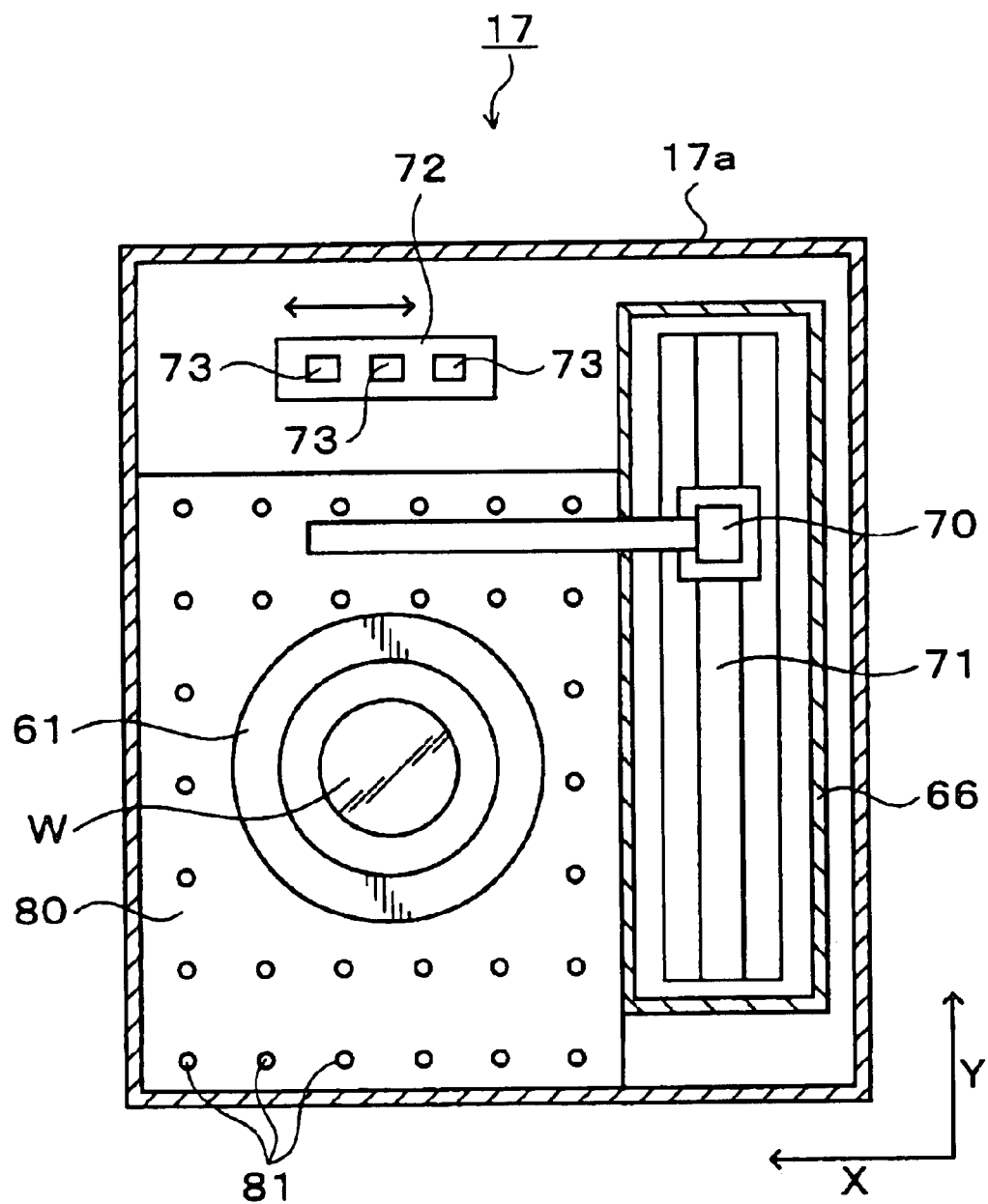
FIG. 5 is an explanatory view of a horizontal cross section of the resist coating unit in FIG. 4.

Next, the structure of the resist coating unit 17 described above will be explained in detail. FIG. 4 is an explanatory view of a vertical cross section showing a schematic structure of the resist coating unit 17 and FIG. 5 is an explanatory view of a horizontal cross section of the resist coating unit 17.

In a center part of a casing 17a of the resist coating unit 17, as shown in FIG. 4, a spin chuck 60 is provided with an upper surface thereof formed to be flat and with a not-shown suction port formed in a center part thereof so that the wafer W which is carried into the resist coating unit 17 is horizontally held by suction onto the spin chuck 60. Under the spin chuck 60, a not-shown drive mechanism which causes the spin chuck 60 to be movable vertically and rotatable is disposed so that the wafer W can be rotated at a predetermined rotational speed when the resist solution is applied on the wafer W and the spin chuck 60 is vertically movable when the wafer W is mounted onto the spin chuck 60.

Around an outer circumference of the spin chuck 60, a circular cup 61 with an upper part thereof being open is provided to surround the outer circumference of the spin chuck 60 so that the resist solution diffused by a centrifugal force from the rotated wafer W which is held by suction onto the spin chuck 60 is received therein and prevented from contaminating peripheral units. In a bottom portion of the cup 61, a not-shown drainpipe for draining out the resist solution which is spilled and diffused from the wafers W is formed.

A first exhaust pipe 62 for exhausting an atmosphere inside the cup 61 is provided to extend from a bottom portion of the cup 61. The first exhaust pipe 62 is communicated with a suction unit 63 via a second exhaust pipe 83 as described later so that the atmosphere inside the cup 61 can be actively exhausted by the suction unit 63. In the first exhaust pipe 62, a first damper 64 serving as a first adjusting device is provided to adjust a flow rate of gas flowing through the first exhaust pipe 62.

On a side in a negative direction of the X direction (a right direction in FIG. 4 and FIG. 5) of the cup 61, a case 66, which serves as an accommodating portion, having a rectangular parallelepiped outer shape which is oblong in the Y direction (a vertical direction in FIG. 5) as shown in FIG. 5 is provided. Inside the case 66, provided is a nozzle carrier 68, which serves as a carrier, for carrying a resist solution supply nozzle 67, which serves as a coating solution supply nozzle, for discharging the resist solution onto the wafer W.

The nozzle carrier 68 includes a nozzle holding member 69 for holding the resist solution supply nozzle 67 to be suspended therefrom and an arm portion 70 to which the nozzle holding member 69 is fixed, as shown in FIG. 4. In the arm portion 70, a not-shown drive mechanism is provided and the drive mechanism enables the arm portion 70 to move along a rail 71 which extends in the Y direction as shown in FIG. 5 and to expand and contract in the Z direction. Therefore, the resist solution supply nozzle 67 held by the nozzle holding member 69 is movable in the Y and Z directions.

The nozzle holding member 69 is fixed in such a position that the nozzle holding member 69 is positioned above the center of the wafer W when the arm portion 70 moves to a position above the center of the wafer W so that the resist solution is supplied to the center of the wafer W from the resist solution supply nozzle 67 which is held by the nozzle holding member 69.

In an upper surface of the case 66, a plurality of first ventilation holes 66a are formed and a second ventilation hole 66b is formed in a lower part on a cup 61 side of the case 66 so that gas from the first ventilation holes 66a passes through the case 66 and is discharged from the second ventilation hole 66b to an area below the cup 61.

Outside the cup 61 on a positive direction side of the Y direction (the upward direction in FIG. 5), a nozzle box 72 for keeping the above-mentioned resist solution supply nozzle 67 on stand-by therein is provided. In the nozzle box 72, a plurality of recessed portions 73 having the same outer shape as that of the resist solution supply nozzle 67 are formed so that the resist solution supply nozzle 67 is allowed to be received and kept on stand-by in the recessed portion 73. The nozzle box 72 is structured to be movable in the X direction and the X direction movement of the nozzle box 72 causes a desired resist solution supply nozzle 67 to be positioned below the nozzle holding member 69 which is fixed to the nozzle carrier 68 and enables the descending nozzle holding member 69 to hold the resist solution supply nozzle 67.

A supply pipe 74, which serves as a supply device, for supplying predetermined gas, for example, air, which is the atmosphere, and inert gas, into the casing 17a, is provided to extend from an upper surface of the casing 17a. In the supply pipe 74, a damper 75 is attached to adjust a flow rate of the gas supplied into the casing 17a to a predetermined flow rate. As the inert gas, for example, nitrogen gas, helium gas, and the like are usable.

On a downstream side of the damper 75 of the supply pipe 74, a temperature/humidity adjusting device 76 is disposed so that the gas flowing through the supply pipe 74 can be supplied into the casing 17a after being adjusted to appropriate temperature and humidity.

Figure 6:
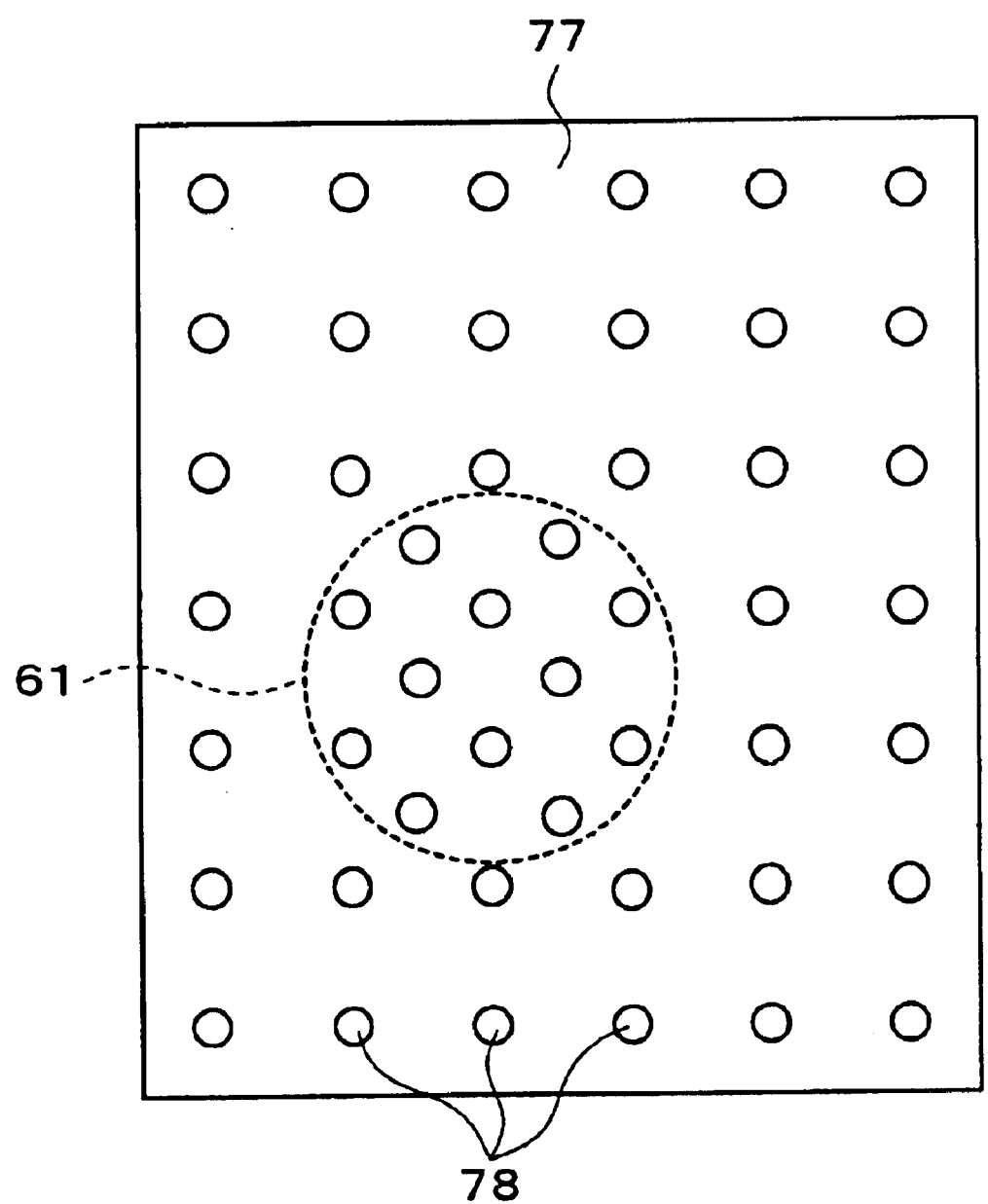
FIG. 6 is a plan view of a flow dividing plate used in the resist coating unit.

In an upper portion inside the casing 17a, a flow dividing plate 77 for dividing the gas supplied from the supply pipe 74 is provided to be parallel to the upper surface of the casing 17a. In the flow dividing plate 77, a number of ventilation holes 78 are formed as shown in FIG. 6 and the ventilation holes 78 are more densely formed in an area facing the cup 61, which is placed below the flow dividing plate, than in other areas. This structure causes the gas supplied from the supply pipe 74 to be divided by passing through each of the ventilation holes 78 so that a stable descending air current is formed in the entire casing 17a. More of the ventilation holes 78 are disposed in the area facing the cup 61 to supply more gas into the cup 61.

At a position below the flow dividing plate 77 as high as the position of the cup 61, a current plate 80 is disposed horizontally to surround the outer circumference of the cup 61. In the current plate 80, a number of holes 81 are formed as shown in FIG. 5 and the gas after passing through the flow dividing plate 77 passes through the holes 81 so that a linear descending air current is formed from the flow dividing plate 77 to the current plate 80.

A second exhaust pipe 83, which serves as a second exhaust pipe, with an exhaust port 82 thereof facing upward is provided to extend from an inner bottom portion of the casing 17a so that an atmosphere inside the casing 17a can be actively exhausted by the suction unit 63. In the second exhaust pipe 83, a second damper 84, which serves as a second adjusting device, for adjusting a flow rate of the atmosphere flowing through the second exhaust pipe 83 is attached. A downstream side of the first exhaust pipe 62 which extends from the cup 61 is communicated with the second exhaust pipe 83 on an upstream side of the second damper 84 and the atmosphere inside the cup 61 is also exhausted through the second exhaust pipe 83 in the end. As described above, the gas from the first exhaust pipe 62 is confluent with the second exhaust pipe 83 but the exhaust flow rate of the first exhaust pipe 62 is adjusted by the first damper 64 which is provided on the upstream side so that the second damper 84 adjusts only the flow rate of the atmosphere inside the casing 17a which is exhausted from the exhaust port 82.

The first damper 64 in the first exhaust pipe 62, the damper 75 in the supply pipe 74, and the second damper 84 in the second exhaust pipe 83 described above are controlled by a controller 85 and the controller 85 enables the flow rates of the air currents flowing through the first exhaust pipe 62, the second exhaust pipe 83, and the supply pipe 74 to be maintained at predetermined flow rates and the flow rates to be changed to predetermined flow rates at predetermined timing.

Next, the operation of the resist coating unit 17 as structured above is explained together with the steps of a photolithography process performed in the coating and developing treatment system 1.

First, the wafer carrier 7 takes out one unprocessed wafer W from the cassette C and carries it to the adhesion unit 31 which is included in the third processing unit group G3. The wafer W, which is coated with an adhesion promoter such as HMDS for improving fixability with the resist solution in the adhesion unit 31, is carried to the cooling unit 30 by the main carrier 13 and cooled to predetermined temperature. Thereafter, the wafer W is carried to the resist coating unit 17 or 19.

The wafer W with the resist film formed thereon is carried again to the pre-baking unit 33 or 34 and the extension and cooling unit 41 in sequence by the main carrier 13 to undergo predetermined processing.

Then, the wafer W is taken out from the extension and cooling unit 41 by the wafer carrier 50 and carried to the aligner (not-shown) via the peripheral aligner 51. The wafer W after undergoing the exposure processing is carried to the extension unit 42 by the wafer carrier 50 and further carried to the post-exposure baking unit 44 or 45, the developing unit 18 or 20, the post-baking unit 35, 36, 46, or 47, and the cooling unit 30 in sequence by the main carrier 13 to undergo predetermined processing in each of the units. Thereafter, the wafer W is returned to the cassette C by the wafer carrier 7 via the extension unit 32 and a series of predetermined coating and developing treatment is finished.

Next, the operation of the resist coating unit 17 described above will be explained in detail. First, the supply of the air whose temperature and humidity is adjusted is started into the casing 17a from the supply pipe 74 before the wafer W is carried to the resist coating unit 17. The flow rate of the supplied air at this time is adjusted to, for example, 2.1 $m^3$/min. by the controller 85 and the damper 75 so that the speed of the air flowing through the supply pipe 74 is, for example, made to be approximately 0.3 m/s.

Synchronously with this operation, the suction unit 63 starts to operate so that the atmosphere inside the cup 61 is exhausted from the first exhaust pipe 62 and the atmosphere inside the casing 17a starts to be exhausted from the exhaust port 82. At this time, the flow rate inside the first exhaust pipe 62 is adjusted to, for example, 1.5 $m^3$/min., which is a first flow rate, and the flow rate inside the second exhaust pipe 83 is adjusted to, for example, 2.0 $m^3$/min, which is a second flow rate.

As a result, the air of 2.1 $m^3$/min. which is supplied from the supply pipe 74 passes through the flow dividing plate 77 to be supplied into the entire casing 17a, and the air of 1.5 $m^3$/min. out of the supplied air flows into the cup 61 and is exhausted from the first exhaust pipe 62 while purging the inside of the cup 61. Meanwhile, the air of 0.5 $m^3$/min. (a difference between the first flow rate and the second flow rate) out of the supplied air passes through the current plate 80 or the case 66 and is exhausted from the exhaust port 82 through the second exhaust pipe 83 while forming the descending air current inside the casing 17a. The remaining air of 0.1 $m^3$/min. serves for maintaining the pressure inside the casing 17a at the positive pressure.

As described above, the resist coating treatment for the wafer W is started after the atmospheres inside the casing 17a and the cup 61 are maintained in appropriate conditions. First, the wafer W is carried into the resist coating unit 17 by the main carrier 13, delivered to the spin chuck 60 which is ascended and kept on stand-by in advance, and thereafter held by suction onto the spin chuck 60. Then, the spin chuck 60 is descended to place the wafer W in a predetermined position inside the cup 61.

When the wafer W is placed in the predetermined position inside the cup 61, the nozzle carrier 68 moves in the Y direction to hold the resist solution supply nozzle 67 which is kept on stand-by in the nozzle box 72. Then, it moves in the Y direction again to transfer the resist solution supply nozzle 67 to a position above the center of the wafer W. Next, the rotation of the wafer W is started at a predetermined rotational speed, for example, at 100 rpm, by the spin chuck 60. At this time, the exhaust flow rate in the first exhaust pipe 62 is increased, for example, from 1.5 $m^3$/min. to 2.0 $m^3$/min. by the first damper 64.

After that, the resist solution is discharged from the resist solution supply nozzle 67 and a predetermined amount of the resist solution is supplied onto the center of the wafer W. Then, the rotational speed of the wafer W is increased to, for example, 4,000 rpm, after the predetermined amount of the resist solution is supplied so that the resist solution on the wafer W is diffused onto the entire surface of the wafer W to form the resist film. Thereafter, the rotational speed of the wafer W is reduced to, for example, 2,500 rpm and the resist solution is further diffused to make the resist film thin. Then, when the resist film with a predetermined film thickness is formed, the rotation of the wafer W is stopped. At this time, the exhaust flow rate inside the first exhaust pipe 62 is decreased from 2.0 $m^3$/min. to 1.5 $m^3$/min.

When the predetermined resist film is thus formed on the wafer W and the rotation of the wafer W is stopped, the resist solution supply nozzle 67 is transferred again to the nozzle box 73 to be returned to the recessed portion 74 of the nozzle box 73. Meanwhile, the wafer W on which the resist film is formed is ascended by the spin chuck 60 again and delivered to the main carrier 13 from the spin chuck 60. Then, the resist coating treatment is finished when the wafer W is carried from the resist coating unit 17 to the pre-baking unit 33 where the subsequent process is carried out.

According to the above embodiment, the second exhaust pipe 83 for exhausting the atmosphere inside the casing 17a and the first exhaust pipe 62 for exhausting the atmosphere inside the cup 61 are separately provided so that the pressure inside the casing 17a can be adjusted to the positive pressure with the use of only the second exhaust pipe 83. Therefore, the first exhaust pipe 62 does not need to be burdened with both of the works of exhausting the atmosphere inside the cup 61 and performing the positive pressure adjustment, as is conventionally required, so that the atmospheres inside the casing 17a and the cup 61 can easily be adjusted.

The first exhaust pipe 62 is provided to be connected to the second exhaust pipe 83 so that the atmospheres inside the cup 61 and the casing 17a can finally be exhausted from one exhaust pipe, and thereby only one piping system is required for exhausting the atmospheres.

The current plate 80 is provided around the cup 61 so that the descending air current inside the casing 17a which is formed by providing the second exhaust pipe 82 is uniformly formed inside the casing 17a. This enables impurities inside the casing 17a to be appropriately discharged.

Furthermore, the exhaust flow rate inside the cup 61 is increased only when the resist solution is supplied onto the rotated wafer W and the resist solution is diffused so that mist, which is produced from the resist solution in a large amount at the above timing, is prevented from flowing out of the cup 61 into the casing 17a.

According to the above embodiment, the first exhaust pipe 62 is provided to be connected to the second exhaust pipe 83 as described above but the first exhaust pipe 62 and the second exhaust pipe 83 may be provided independently without being connected to each other. In this case, the pressure inside the casing 17a and the exhaust flow rate inside the cup 61 can also be adjusted by different exhaust pipes, which makes it possible to facilitate the atmosphere control while the resist treatment is carried out, compared with a conventional art.

According to the above embodiment, the atmosphere inside the case 66 of the nozzle carrier 68 is exhausted by the second exhaust pipe 83 similarly to the atmosphere inside the casing 17a but an exhaust pipe for exhausting the atmosphere inside the case 66 may separately be provided.

Figure 7:
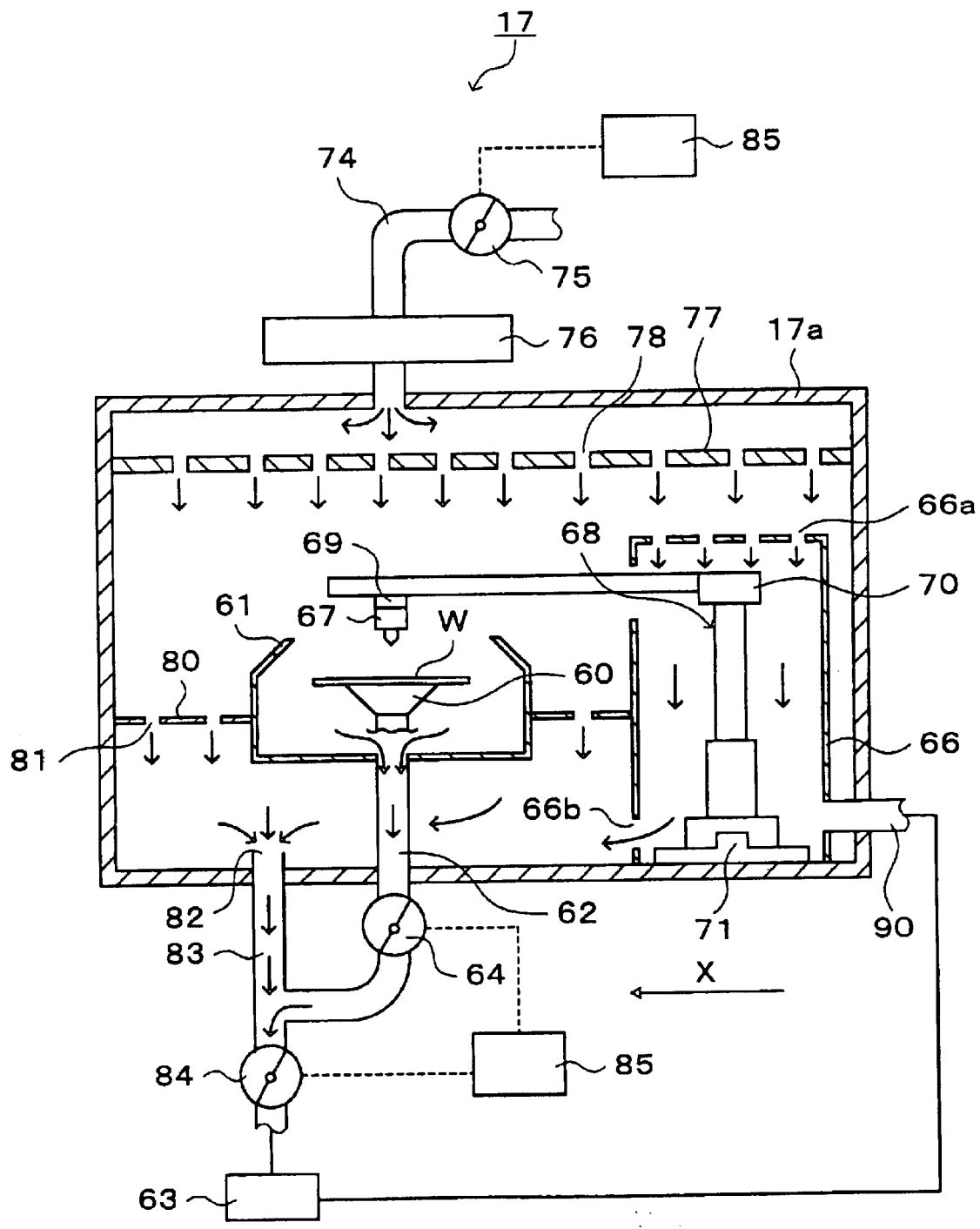
FIG. 7 is an explanatory view of a vertical cross section showing another structure example of the resist coating unit.

In this case, for example, as shown in FIG. 7, it is proposed that an exhaust pipe 90 serving as a third exhaust pipe is provided to extend from a lower part of a side surface of the case 66 so that the atmosphere inside the case 66 can actively be exhausted, for example, by the suction unit 63. When the wafer W undergoes the resist coating treatment, the atmosphere inside the case 66 needs to be constantly exhausted and purged. Thereby, a clean atmosphere can be maintained around the nozzle carrier 68 which includes many drive mechanisms and in which impurities are easily produced and the impurities are prevented from adhering to the wafer W inside the cup 61.

The atmosphere inside the case 66 may constantly be exhausted while the resist coating treatment is performed, as described above, but may be exhausted only when the resist solution supply nozzle 67 which is held by the nozzle carrier 68 is placed above the wafer W. In other words, the atmosphere inside the case 66 is exhausted only when the impurities produced in the nozzle carrier 68 tend to easily drop onto the wafer W. Thereby, the atmosphere is prevented from being exhausted unnecessarily and excessively to stabilize the air current inside the casing 17a and reduce power consumption which is required for exhausting.

According to the above embodiment, the coating unit applies the resist solution on the wafer W to form the resist film but the present invention is applicable to a coating unit for applying a coating solution other than the resist solution, for example, a developing solution. It is also applicable to a coating unit for substrates other than the wafer W, for example, an LCD substrate.

According to the present invention, different pipes are usable for exhausting the atmosphere inside the casing to maintain the pressure inside the casing at the positive pressure and exhausting the atmosphere inside the cup to prevent the atmosphere inside the cup from flowing out, which makes it possible to realize easier atmosphere control satisfying a plurality of conditions.

Moreover, according to the present invention, the atmospheres inside the casing and the cup can be exhausted only with one piping system so that a piping facility thereof is simplified and unnecessary facilities can be omitted to realize cost reduction.

What is claimed is:

1. A coating unit for applying a coating solution on a substrate, comprising:
    a container enclosing the substrate;
    a casing for accommodating said container therein;
    a supply device for supplying a predetermined gas into said casing;
    a first exhaust pipe for exhausting an atmosphere inside said container;
    a second exhaust pipe for exhausting an atmosphere inside said casing;
    a first adjusting device which is disposed in said first exhaust pipe, for adjusting a flow rate of an atmosphere passing through said first exhaust pipe; and
    a second adjusting device which is disposed in said second exhaust pipe, for adjusting a flow rate of an atmosphere passing through said second exhaust pipe,
    wherein a downstream side of said first exhaust pipe is connected to an upstream side of said second adjusting device in said second exhaust pipe.

2. A coating unit according to claim 1,
    wherein the gas is supplied from a top portion of said casing in a downward direction by said supply device, and
    wherein said second exhaust pipe is disposed to extend from a bottom portion of said casing.

3. A coating unit according to claim 2, further comprising:
    a current plate for straightening a descending air current caused to occur inside said casing by said supply device and said second exhaust pipe.

4. A coating unit according to claim 3, further comprising:
    a carrier for carrying a coating solution supply nozzle for supplying the coating solution to the substrate which is placed inside said container;
    an accommodating portion for accommodating said carrier which is disposed inside said casing; and
    a third exhaust pipe for exhausting an atmosphere inside said accommodating portion.

5. A coating unit for applying a coating solution on a substrate, comprising:
    a container enclosing the substrate;
    a casing for accommodating said container therein;
    a supply device for supplying a predetermined gas into said casing;
    a first exhaust pipe for exhausting an atmosphere inside said container;
    a second exhaust pipe for exhausting an atmosphere inside said casing;
    a first adjusting device which is disposed in said first exhaust pipe, for adjusting a flow rate of an atmosphere passing through said first exhaust pipe;
    a second adjusting device which is disposed in said second exhaust pipe, for adjusting a flow rate of an atmosphere passing through said second exhaust pipe;
    a carrier for carrying a coating solution supply nozzle for supplying the coating solution to the substrate which is placed inside said container;
    an accommodating portion for accommodating said carrier which is disposed inside said casing; and
    a third exhaust pipe for exhausting an atmosphere inside said accommodating portion.

6. A coating unit according to claim 5,
    wherein the gas is supplied from a top portion of said casing in a downward direction by said supply device, and
    wherein said second exhaust pipe is disposed to extend from a bottom portion of said casing.

7. A coating unit according to claim 5, further comprising:
    a current plate for straightening a descending air current caused to occur inside said casing by said supply device and said second exhaust pipe.

8. A coating unit for applying a coating solution on a substrate, comprising:
    a container enclosing the substrate;
    a casing for accommodating said container therein;
    a supply device for supplying a predetermined gas into said casing;
    a first exhaust pipe for exhausting an atmosphere inside said container;
    a second exhaust pipe for exhausting an atmosphere inside said casing;
    a first adjusting device which is disposed in said first exhaust pipe, for adjusting a flow rate of an atmosphere passing through said first exhaust pipe;
    a second adjusting device which is disposed in said second exhaust pipe, for adjusting a flow rate of an atmosphere passing through said second exhaust pipe,
    a carrier for carrying a coating solution supply nozzle for supplying the coating solution to the substrate which is placed inside said container;
    an accommodating portion for accommodating said carrier which is disposed inside said casing; and a third exhaust pipe for exhausting an atmosphere inside said accommodating portion, wherein a downstream side of said first exhaust pipe is connected to an upstream side of said second adjusting device in said second exhaust pipe.

9. A coating unit for applying a coating solution on a substrate, comprising:

a container enclosing the substrate;

a casing for accommodating said container therein;

a supply device for supplying a predetermined gas into said casing;

a first exhaust pipe for exhausting an atmosphere inside said container;

a second exhaust pipe for exhausting an atmosphere inside said casing;

a first adjusting device which is disposed in said first exhaust pipe, for adjusting a flow rate of an atmosphere passing through said first exhaust pipe;

a second adjusting device which is disposed in said second exhaust pipe, for adjusting a flow rate of an atmosphere passing through said second exhaust pipe;

a current plate for straightening a descending air current caused to occur inside said casing by said supply device and said second exhaust pipe;

a carrier for carrying a coating solution supply nozzle for supplying the coating solution to the substrate which is placed inside said container;

an accommodating portion for accommodating said carrier which is disposed inside said casing; and a third exhaust pipe for exhausting an atmosphere inside said accommodating portion, wherein the gas is supplied from a top portion of said casing in a downward direction by said supply device, and wherein said second exhaust pipe is disposed to extend from a bottom portion of said casing.

* * * * *